United States Patent
Togawa et al.

(10) Patent No.: US 8,243,941 B2
(45) Date of Patent: Aug. 14, 2012

(54) ACTIVE NOISE REDUCTION SYSTEM AND ACTIVE NOISE REDUCTION METHOD

(75) Inventors: Taro Togawa, Kawasaki (JP); Takeshi Otani, Kawasaki (JP); Kaori Endo, Kawasaki (JP); Yasuji Ota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 319 days.

(21) Appl. No.: 12/585,244

(22) Filed: Sep. 9, 2009

(65) Prior Publication Data
US 2010/0002892 A1    Jan. 7, 2010

Related U.S. Application Data

(63) Continuation of application No. PCT/JP2007/057204, filed on Mar. 30, 2007.

(51) Int. Cl.
*A61F 11/06* (2006.01)
(52) U.S. Cl. .................... 381/71.1; 381/71.12
(58) Field of Classification Search .................. 381/1, 2, 381/8, 9, 11, 12, 13, 14, 71.1, 71.2, 71.8, 381/71.9, 71.11–71.14
See application file for complete search history.

(56) References Cited

U.S. PATENT DOCUMENTS

| | | | |
|---|---|---|---|
| 5,325,437 A | | 6/1994 | Doi et al. |
| 6,002,778 A | * | 12/1999 | Rossetti et al. ............. 381/71.4 |
| 6,160,893 A | * | 12/2000 | Saunders et al. ............. 381/71.6 |
| 7,308,106 B2 | * | 12/2007 | Vaudrey et al. ................ 381/72 |
| 7,317,802 B2 | * | 1/2008 | Wurtz .......................... 381/71.6 |
| 7,536,018 B2 | * | 5/2009 | Onishi et al. ................. 381/71.8 |
| 7,574,006 B2 | * | 8/2009 | Funayama et al. ......... 381/71.12 |
| 7,864,969 B1 | * | 1/2011 | Ma et al. ........................ 381/92 |

FOREIGN PATENT DOCUMENTS

| | | |
|---|---|---|
| JP | 6-129701 | 5/1994 |
| JP | 6-236190 | 8/1994 |
| JP | 07-084584 | 3/1995 |
| JP | 8-83084 | 3/1996 |
| JP | 2872545 | 1/1999 |
| JP | 2921232 | 4/1999 |
| JP | 2001-51703 | 2/2001 |

OTHER PUBLICATIONS

International Search Report for PCT/JP2007/057204, mailed Aug. 7, 2007.
Bernard Widrow, et al. "Adaptive Signal Processing", Prentice-Hall, Inc., Englewood Cliffs, N.J. 07632, 15 pages.

* cited by examiner

*Primary Examiner* — Vivian Chin
*Assistant Examiner* — Friedrich W Fahnert
(74) *Attorney, Agent, or Firm* — Fujitsu Patent Center (57) ABSTRACT

As optimal candidate as a control signal (y*) for generating a control sound suppressing noise from a speaker is selected from among a plurality of control signal candidates (y1 to yn) by a selection function unit. For this selection, a residual noise estimation function unit receiving as input a residual noise signal (e) from an error microphone is introduced. The function unit first obtains an estimated value of a noise component using a first transfer characteristic simulating filter. Further, this noise component estimated value and filtered outputs from second transfer characteristic simulating filters are used to obtain residual noise estimated values for the control signal candidates (y1 to yn). Further, the single control signal candidate corresponding to the smallest of these residual noise estimated values is selected and used as the above control signal (y*).

18 Claims, 9 Drawing Sheets

ACTIVE NOISE REDUCTION SYSTEM AND ACTIVE NOISE REDUCTION METHOD

CROSS-REFERENCE TO RELATED APPLICATION

This application is a continuation application based on International Application No. PCT/JP2007/057204, filed on Mar. 30, 2007, the contents being incorporated herein by reference.

FIELD

The present embodiments relate to an active noise reduction system and active noise reduction method using active noise control (ANC) technology and a program for executing that method.

This active noise reduction causes interference between noise and a sound wave having the same amplitude and the opposite phase (control sound) so as to reduce the noise by the resultant interference effect. In recent years, for example, it has been widely utilized for noise reduction systems for controlling air-conditioner noise or factory or automobile cabin noise.

BACKGROUND

Figure 8:
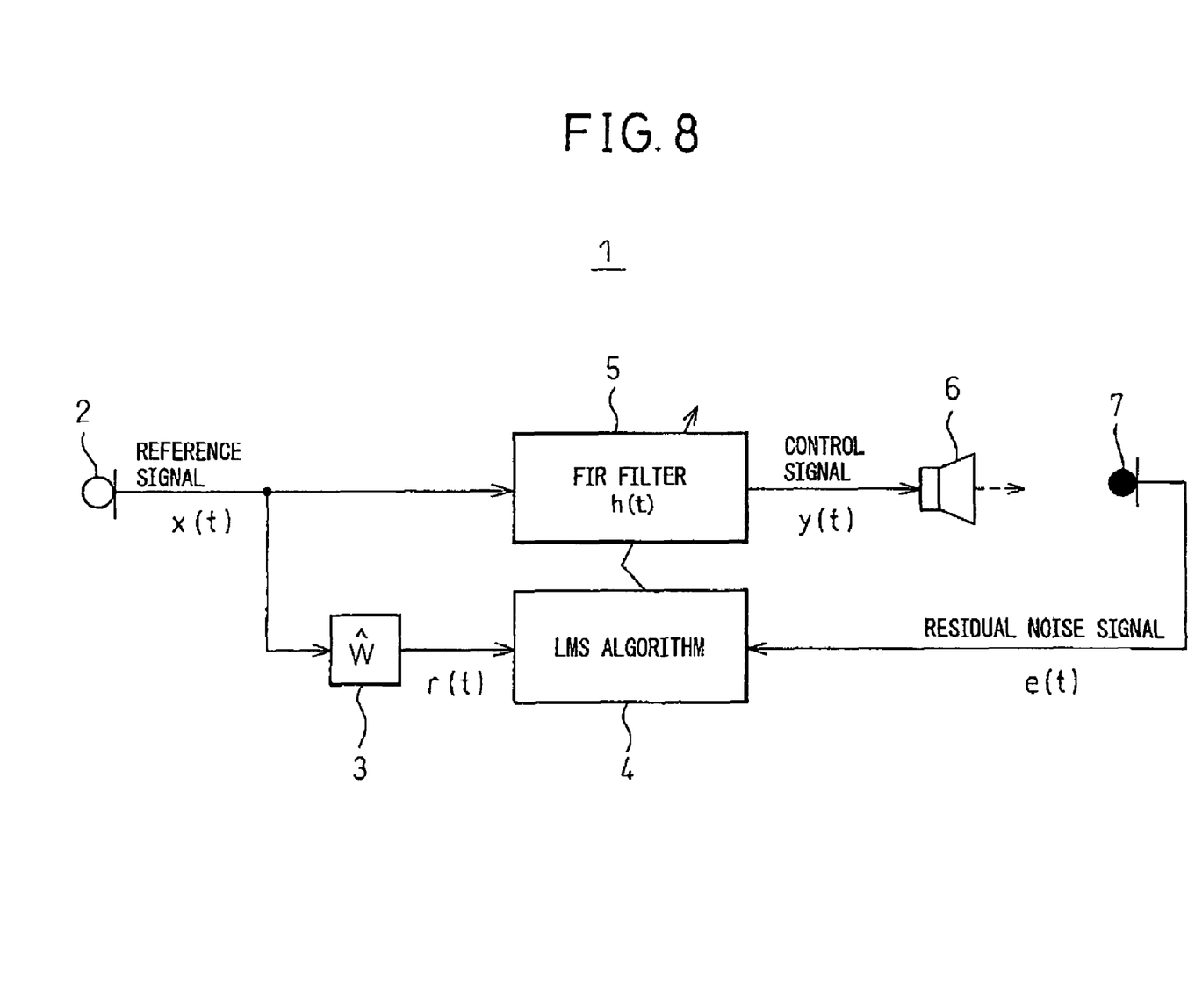
FIG. 8 is a view illustrating a first example of the related art.

FIG. 8 is a view illustrating a first example of the related art. In the figure, reference numeral 1 indicates an active noise reduction system. As illustrated, it is comprised of a sensor microphone 2, a digital filter 3, a least mean square (LMS) algorithm 4, a finite impulse response (FIR) filter 5, a control use speaker 6, and an error microphone 7.

The active noise reduction system 1 according to this first example of the related art is an active noise reduction system exhibiting a high noise reduction performance for noise applied from a specific direction (for example, see the later-mentioned Patent Document 1). As illustrated in this figure, the sensor microphone 2 set in the noise arrival direction detects a signal expressing the generated noise (reference signal) and outputs a control sound generated by this reference signal from the control use speaker 6.

Further, the error microphone 7 is used, set, at the noise reduction area where it is desired to reduce the noise, so as to detect residual noise e(t) after interference between the control sound and the noise and adaptively find the filter coefficient of the FIR filter 5 which generates a control signal y(t) from the above reference signal so that this residual noise e(t) becomes the smallest. This makes it possible to realize stable noise reduction performance while tracking changes in the microphones 2 and 7 or speaker 6 over time and even changes in the temperature or humidity in the spatial transfer system. The active noise reduction system 1 having configuration, as is the above first example, is called a "feedforward type ANC".

As the adaptive algorithm (4) used here, up until now, the LMS, recursive least squares (RLS), and numerous other algorithms have been proposed. However, it is necessary to generate the control sound from the speaker 6 in real time, so the filtered-x LMS (least mean square) algorithm which requires the small amount of processing is frequently used (see the later-mentioned Non-Patent Document 1). The basic principle is to update the filter coefficient of the FIR filter 5 based on the "fastest reduction method" so that the residual noise e(t) is reduced while taking into consideration the transfer characteristics of the sound which travels from the control use speaker 6 to the error microphone 7.

As illustrated in the figure, the reference signal at the time t is designated as x(t). This reference signal x(t) is converted to a vector to obtain a vectored $x(t)=[x(t), x(t-1), \ldots, x(t-N_w+1)]$. The following transfer function expressing the transfer characteristic between the control use speaker 6 and the error microphone 7

$$\hat{w}=[\hat{w}(1), \hat{w}(2), \ldots, \hat{w}(N_w)]$$

where Nw is the tap number of the filter.

The above /w is convoluted to obtain the signal (filtered reference signal) r(t) expressed by the following formula (1):

$$r(t)=\hat{w}*x(t) \quad (1)$$

where, * indicates convolution of the vector.

The update formula of the filter coefficient of the FIR filter 5 can be converted to the following formula (2) using $r(t)=[r(t), r(t-1), \ldots, r(t-N_h+1)]$ for converting the signal of formula (1) to a vector.

$$h(t+1)=h(t)+\mu \cdot e(t) \cdot r(t) \quad (2)$$

where, e(t) is the residual noise signal at the time t, and μ is the parameter of the step size and, further,
$h(t)=[h(1, t), h(2, t), \ldots, h(N_h,t)]$ expresses the filter coefficient of the adaptive filter at the time t.

However, if trying to effectively reduce noise in a noise reduction area even for various noise arriving from various directions, it would be necessary to prepare a plurality of the above active noise reduction systems 1. In this regard, if trying to simultaneously reduce noise arriving from a plurality of directions, the inconvenience arises that convergence of filter coefficients could no longer be guaranteed due to the interference among the control use speakers 6. Further, if trying to take even that mutual interference into consideration, the amount of processing of the CPU would further increase and therefore real time noise reduction would become difficult.

Figure 9:
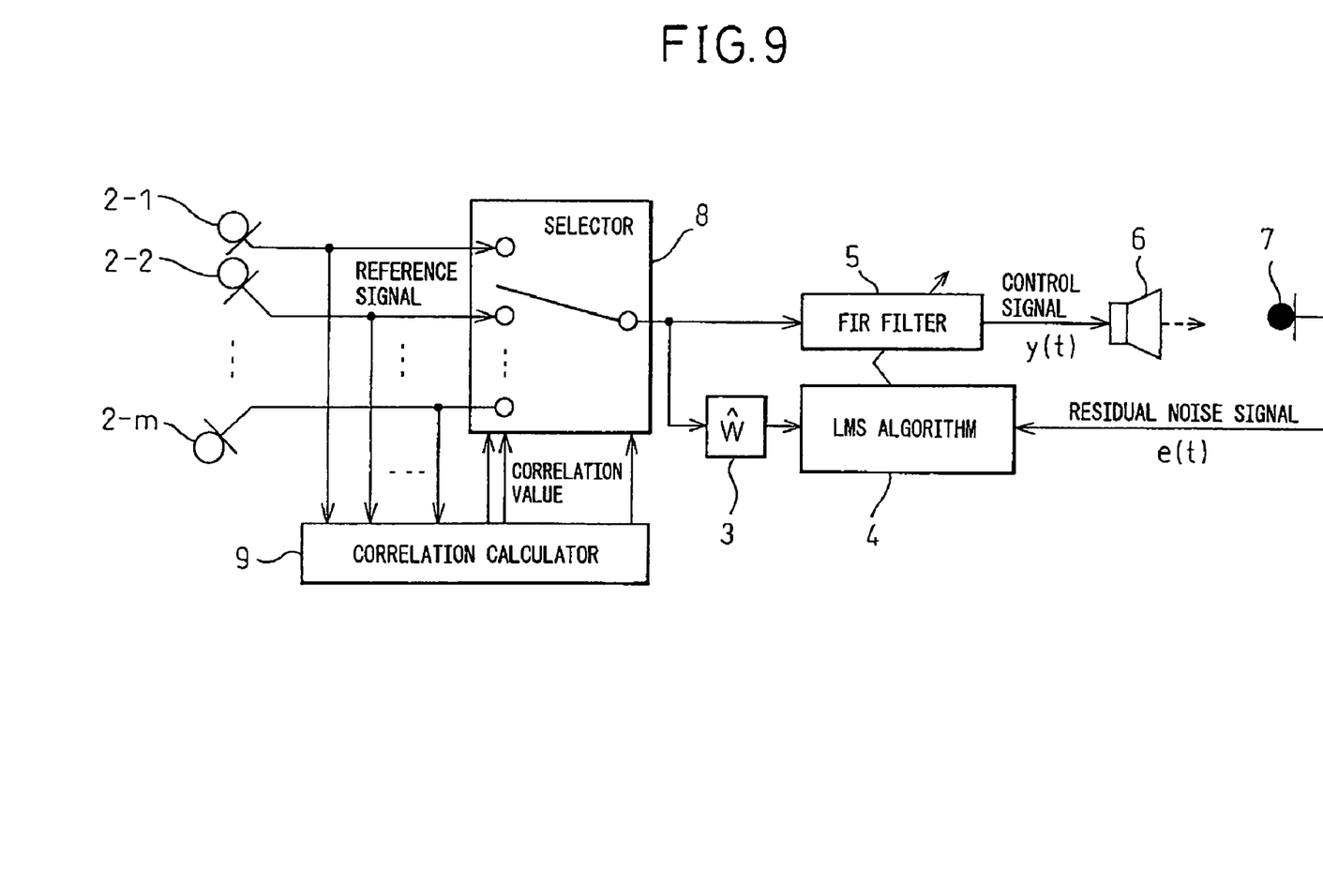
FIG. 9 is a view illustrating a second example of the related art.

To deal with this inconvenience, there has been proposed the active noise reduction system 1 of a second example of the related art illustrated in FIG. 9. Note that throughout the drawings, similar components are assigned the same reference numerals or symbols.

The characterizing feature of the second example of the related art illustrated in FIG. 9, as clear from a comparison with the first example of the related art, is, first, to obtain a high noise reduction effect for noise arriving from various directions by arranging a plurality of sensor microphones 2-1, 2-2 . . . 2-n around the noise reduction area where it is desired to reduce the noise so as to detect a plurality of reference signals. Further, the characterizing feature is to select the single reference signal with the highest noise reduction effect among the detected plurality of reference signals at a selector 8 and output it to the speaker 6 side.

In this case, to select the single reference signal with the highest noise reduction effect, a correlation calculating unit 9 is introduced. This correlation calculating unit 9 finds the correlation between the reference signals and calculates the correlation values. The single reference signal with the largest correlation value is selected by the selector 8 (For example, see the following Patent Document 2).

Patent Document 1: Japanese Patent No. 2872545
Patent Document 2: Japanese Patent No. 2921232
Non-Patent Document 1: B. Widrow and S. Stearns, Adaptive Signal Processing (Prentice-Hall, Englewood Cliffs, N.J., 1985)

The active noise reduction system 1 of the second example of the related art (FIG. 9) selects the single reference signal used for generation of the control sound from the speaker 6 based on the correlations of the reference signals obtained by the sensor microphones (2-1 to 2-n). Therefore, the residual noise from the error microphone 7 is not taken into consideration at all, and thus the selected optimal reference signal is not a signal which makes this residual noise minimum. Further, the effects on the analog path (secondary path) included in the residual noise such as (i) the transfer characteristics of the control use speaker 6 and error microphone 7 and (ii) the spatial transfer characteristics in the noise reduction area from the control use speaker 6 to the error microphone 7 are not considered. Therefore, there is the issue that it is difficult to select a reference signal which is stable in terms of the changes in the above transfer characteristics on the analog path.

SUMMARY

Accordingly, it is an object of one aspect of the embodiments to provide an active noise reduction system able to optimize the noise reduction control by selecting a reference signal at a selector 8 considering the transfer characteristics of the analog path (secondary path) from the speaker 6 to the error microphone 7. Further, it is another object to provide an active noise reduction method and program for that purpose.

Figure 1:
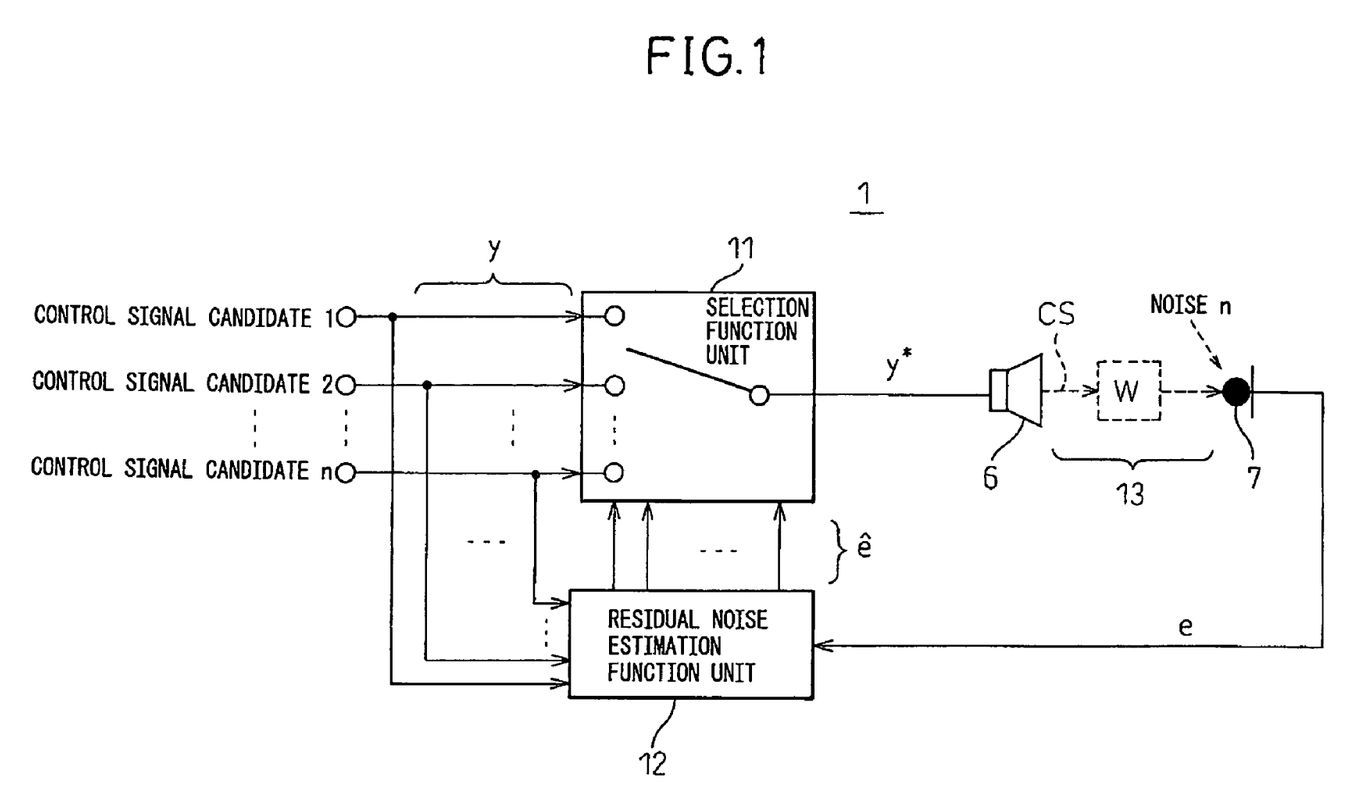
FIG. 1 is a view illustrating the principle of an active noise reduction system according to the present embodiments.

FIG. 1 is a view illustrating an active noise reduction system according to the present embodiments. Note that in the following description, symbols preceded with a slash (/) indicate estimated values (^). For example, $\hat{e} \rightarrow /e$ $\hat{w} \rightarrow /w$ $\hat{n} \rightarrow /n$ However, /e, /w, /n, etc. are not used in the formulas per se or in all drawings.

According to the embodiments, the transfer characteristics of sound along an analog path (secondary path) from the control use speaker 6 to the error microphone 7 are simulated by a digital filter /w and thereby the more suitable control signal y is selected. For this reason, the residual noise estimation function unit 12 is newly introduced.

The other components 11, 6, and 7 in FIG. 1 are substantially equivalent to the components 8, 6, and 7 illustrated in the above-mentioned FIG. 9. The components are a selection function unit 11 selecting and outputting an optimal control signal y* having a high noise reduction effect from a plurality of control signal candidates y(1 to n) serving as candidates of the control signal for generating a control sound CS for suppressing noise n, a speaker 6 outputting a control sound CS generated by an optimal control signal y* from the selection function unit 11, and an error microphone 7 arranged in a noise reduction area 13 forming an area where noise n should be suppressed and detecting and outputting noise, as a residual noise signal e, remaining after interference between the control sound CS from the speaker 6 and the noise n.

Here, the residual noise estimation function unit 12 is provided with the function of receiving as input the above residual noise signal e and control signal y*, obtaining a noise component estimated value /n estimating the noise component, and using this noise component estimated value /n to obtain and output a plurality of residual noise estimated values /e(1 to n) simulated for a plurality of control signal candidates y(1 to n). Further, based on these plurality of residual noise estimated values /e(1 to n), the selection function unit 11 selects the optimal control signal y* having a high noise reduction effect.

According to these embodiments, the transfer characteristics of the analog path, that is, the secondary path, are simulated to simulate an active noise reduction operation by digital signal processing. Due to this, it is possible to virtually evaluate the noise reduction effects in the cases of using the control signal candidates y(1 to n) and possible to accurately select the optimal control signal y*. Accordingly, it is possible to produce an active noise reduction system using outputs from a plurality of sensor microphones 2(1 to n) as input, which noise reduction system can improve the performance in active noise reduction compared with the related art.

Further, by updating the transfer characteristics of the secondary path as needed, it is possible to improve the stability in selection of the optimal control signal y*.

DESCRIPTION OF EMBODIMENTS

Figure 2:
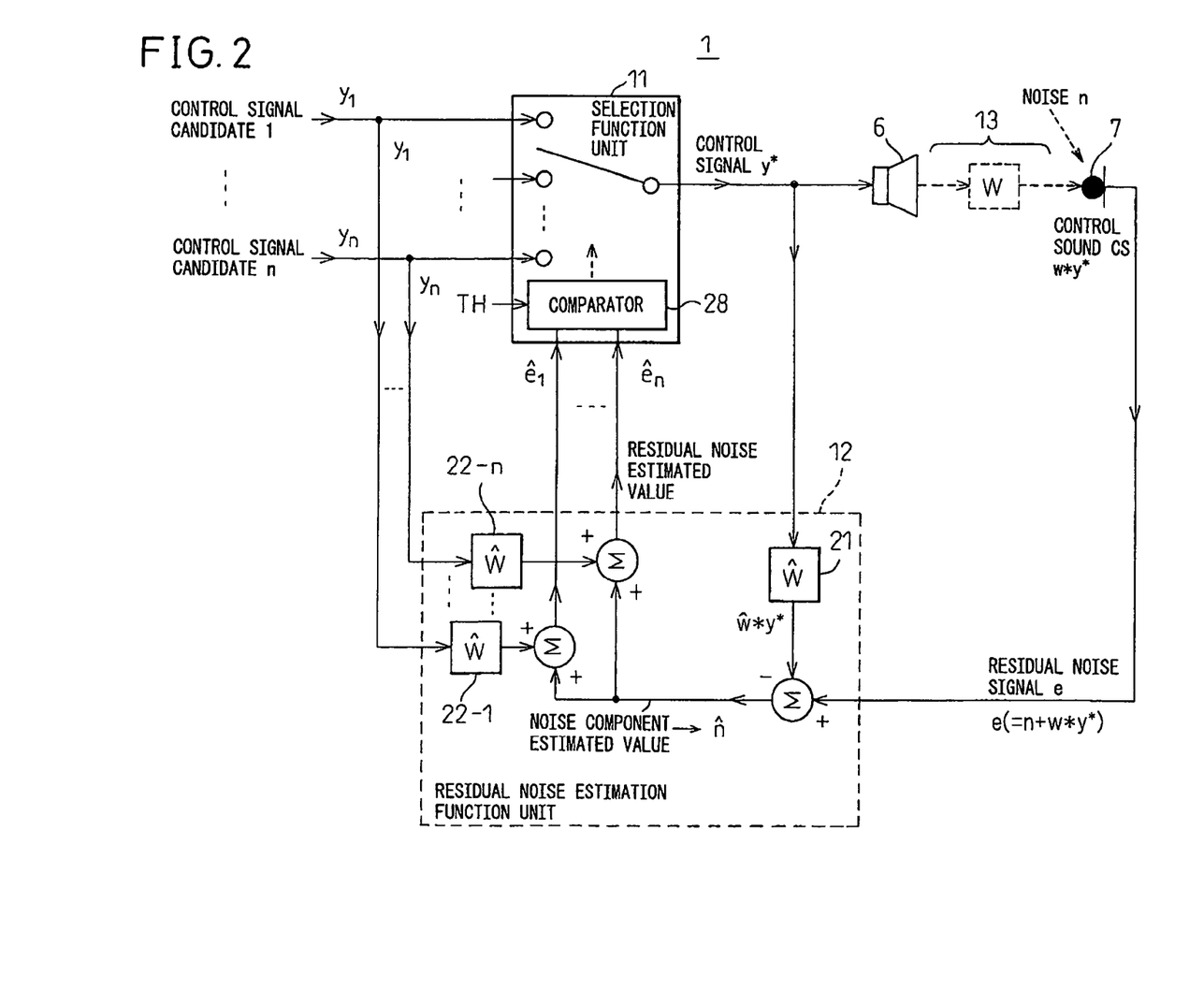
FIG. 2 is a view illustrating the basic configuration of an active noise reduction system according to the present embodiments.

FIG. 2 is a view illustrating the basic configuration of an active noise reduction system according to the present embodiments. According to the figure, the configuration of a residual noise estimation function unit 12 illustrated in FIG. 1 is specifically shown. The characterizing operation in the basic configuration illustrated in this FIG. 2 is as follows:

First, the system subtracts a control sound CS output of a control use speaker 6 from a residual noise signal e detected by an error microphone 7, by using a digital signal processing, while considering the transfer characteristics of the secondary path so as to estimate a noise component n as /n. Further, it uses that noise component estimated value /n to calculate the estimated values of the residual noises /e1 to /en for respective control signal candidates y1 to yn. Further, its selects the optimal control signal y* giving the smallest of the residual noise estimated values (/e1 to /en) from among the control signal candidates y1 to yn.

To realize the above characterizing operation, first, the residual noise estimation function unit 12 has at least transfer characteristic simulating filters (/w) for simulating transfer characteristics of the sound in the noise reduction area 13. In this case, as one transfer characteristic simulating filter (/w), it has a first simulating filter 21 filtering the control signal y*. It subtracts the output of this first simulating filter 21 from the residual noise signal e to obtain a noise component estimated value /n.

Further, as transfer characteristic simulating filters (/w), it has a plurality of second simulating filters 22-1 to 22-n filtering a plurality of control signal candidates y1 to yn and adds the noise component estimated value /n and the outputs of the second simulating filters 22-1 to 22-n to obtain respective residual noise estimated values /e1 to /en.

Here, the residual noise estimation function unit 12 is comprised of a digital signal processor (DSP). The transfer characteristic simulating filters (21 and 22-1 to 22-n) in the digital signal processor are comprised of digital filters having transfer functions equivalent to the above transfer characteristics.

In this way, the system performs filtering which simulates the transfer characteristics of the noise reduction area 13 for all of the control signal candidates y1 to yn, finds the estimated values (/e) of the residual noise for all of the candidates, and selects one of the control signal candidates y1 to yn. On this point, it fundamentally differs from the second example of the related art explained before (FIG. 9). Therefore, the selection function unit 11 can always select the control signal candidate y* suppressing the residual noise to its minimum level.

Note that due to rapid changes in the properties of the noise or the transfer characteristics of the noise reduction area 13, the selection function unit 12 sometimes might not be able to select the optimal candidate. To deal with this case, when it is judged that there is no optimal control signal y* having a high noise reduction effect which the selection function unit 11 should select based on the plurality of residual noise estimated values /e1 to /en, the issuance of the control sound CS from the speaker 6 is stopped. That is, noise reduction control is performed only when there would be a noise reduction effect.

For the above judgment and for selecting the usual optimal control signal, the system has a comparator 28 (FIG. 2) comparing the residual noise estimated values /e1 to /en from the residual noise estimation function unit 12 and a predetermined threshold value TH (FIG. 2). When all of these residual noise estimated values exceed that predetermined threshold value TH, it judges that there is no optimal control signal having a high noise reduction effect. When there is only one residual noise estimated value not exceeding that predetermined threshold value TH, the control signal candidate corresponding to that one value is selected. When there are two or more residual noise estimated values not exceeding that TH, the control signal candidate corresponding to the smallest of these is selected.

Below, a first embodiment and a second embodiment based on the basic configuration of FIG. 2 will be explained.

Figure 3:
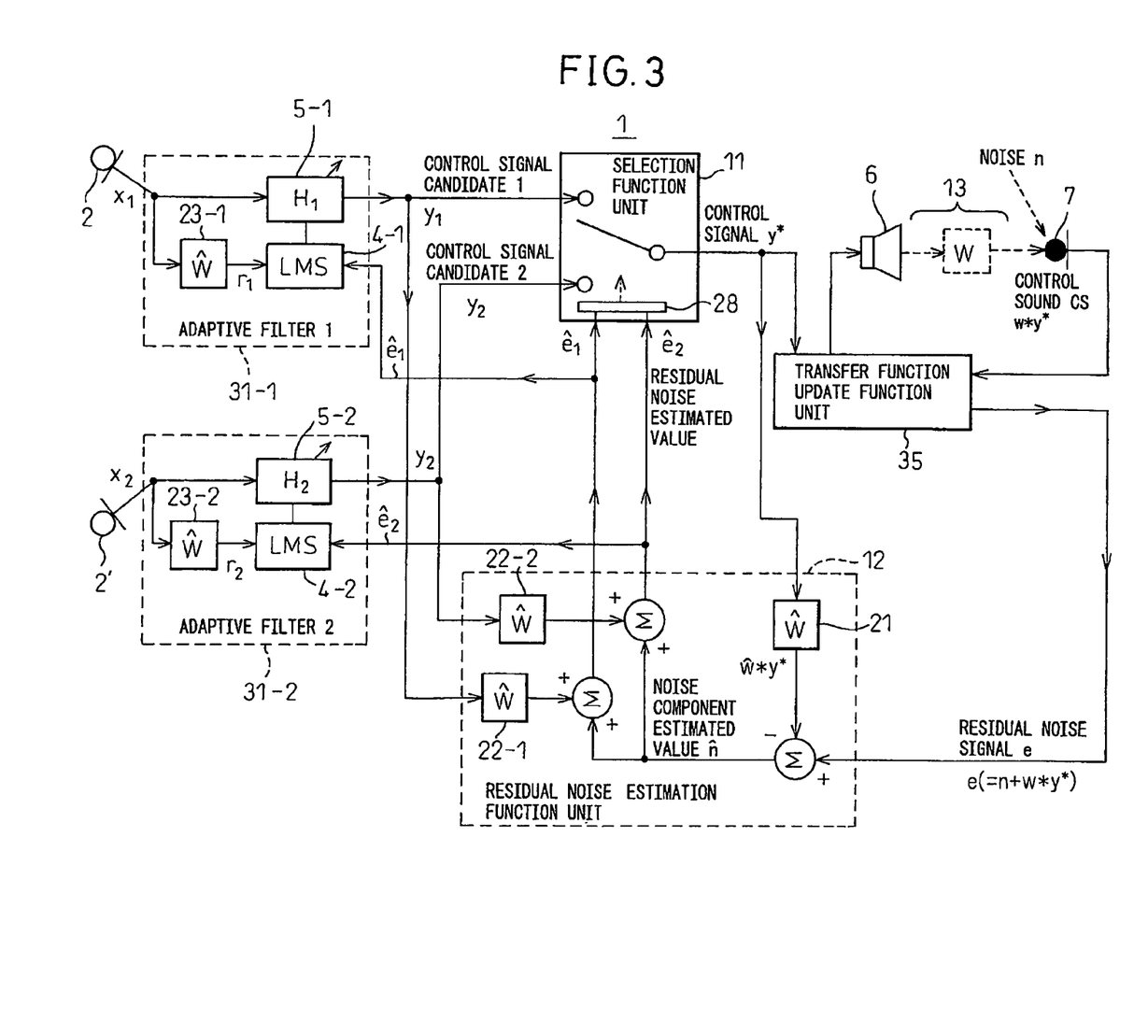
FIG. 3 is a view illustrating a first embodiment of the present embodiments.

FIG. 3 is a view illustrating a first embodiment of the present embodiments. The characterizing configuration of this first embodiment is as follows: In the drawing, first, a sensor microphone 2 and a sensor microphone 2' are arranged at locations corresponding to the noise arrival directions and detect signals representing the generated noises (reference signals). A control use speaker 6, at a later stage, is arranged facing the direction in which it is desired to reduce noise and outputs a control sound CS for interfering with the noise n. An error microphone 7 facing this speaker 6 is arranged in the noise reduction area 13 in which it is desired to reduce noise and detects a residual noise signal e after interference with the control sound CS.

The residual noise estimation function unit 12, receiving as input this residual noise signal e, outputs the residual noise estimated values /e1 and /e2 for respective control signal candidates y1 and y2 by using both the noise component estimated value /n and the control signal candidates y1 and y2 by using transfer functions expressing transfer characteristics of an analog path (secondary path) from the control use speaker 6 to the error microphone 7.

A selection function unit 11, receiving these residual noise estimated values /e1 and /e2, selects the control signal y1 or y2 giving the smallest residual noise detected by the error microphone 7.

First adaptive filters 31-1 and 31-2, receiving the outputs of the above sensor microphones 2 and 2' as inputs, update the filter coefficients H1 and H2 by using the reference signals x1 and x2 and the residual noise estimated values /e1 and /e2 to generate the control signal candidates y1 and y2.

In this case, the transfer function update unit 35 updates the transfer functions corresponding to the transfer characteristics of the analog path (secondary path) from the control use speaker 6 to the error microphone 7 and reflects that update in the transfer functions formed by the first and second simulating filters 21 and 22 in the residual noise estimation function unit 12 and the simulating filters 23-1 and 23-2 in the adaptive filters 31-1 and 31-2.

The characterizing configuration for realizing the first embodiment is that, first, the system has first adaptive filters (31-1 and 31-2) which receives, as input, noise from the sensor microphones (2 and 2') as reference signals (x1 and x2) and filters the input signals to obtain control signal candidates (y1 and y2) from the outputs of the first adaptive filters (31-1 and 31-2). Here, the first adaptive filters (31-1 and 31-2) have FIR filters (4-1 and 4-2) outputting the control signal candidates (y1 and y2), third simulating filters (23-1 and 23-2) as the above-mentioned transfer characteristic simulating filters, and LMS algorithms (5-1 and 5-2) controlling the filter characteristics of the FIR filters (4-1 and 4-2). The system uses the filtered outputs (r1 and r2) from these third simulating filters (23-1 and 23-2) and the residual noise estimated values (/e1 and /e2) to control the filter characteristics of the FIR filters (5-1 and 5-2).

Further, the above transfer characteristic simulating filters are configured by digital filters having transfer functions equivalent to the transfer characteristics, and a transfer function update function unit 35 is provided for updating, as needed, the transfer functions.

Further, if expressing the series of active noise reduction operations under the above first embodiment by time series, the result becomes as follows:

That is, in the first embodiment of FIG. 3, using the current time as "t", the following operations [1] to [8] are repeated:

[1] The error microphone 7 detects the residual noise signal e(t).

[2] The sensor microphones 2 and 2' detect the reference signals $x1(t)$ and $x2(t)$ respectively.

[3] The detected reference signals $x1(t)$ and $x2(t)$ and the filter coefficients $h1(t)$ and $h2(t)$ of the adaptive filters 31-1 and 31-2 are used to generate the control signal candidates $y1(t)$ and $y2(t)$.

$$y1(t)=h1(t)*xi(t)(i=1,2)$$

[4] Among the control signal candidates $y1(t)$ and $y2(t)$, using the average values of the past N numbers of samples' worth of residual noise estimated values /e1 and /e2, the optimal control signal y*(t) is selected, and thereby the control sound CS is output from the control use speaker 6.

$$y*(t) = \begin{cases} y_1(t)\left(\sum_{k=t-N}^{t-1} \hat{e}_1(k)^2 \leq \sum_{k=t-N}^{t-1} \hat{e}_2(k)^2\right) \\ y_2(t)\left(\sum_{k=t-N}^{t-1} \hat{e}_2(k)^2 < \sum_{k=t-N}^{t-1} \hat{e}_1(k)^2\right) \end{cases}$$

[5] The estimated value /n(t) of the noise component is calculated by subtracting the control sound component /w*y*(t) from the residual noise signal e(t).

$$\hat{n}(t) = e(t) - \hat{w}*y(t)$$

[6] The residual noise estimated values /e1(t) and /e2(t) for the control signal candidates y1(t) and y2(t) are calculated.

$$\hat{e}_i(t) = \hat{n}(t) + \hat{w}*y_i(t)(i=1,2)$$

[7] For updating the filter coefficients of the adaptive filters, the transfer characteristics /w of the secondary path are convoluted with the reference signals x1(t) and x2(t) to generate the filtered reference signals r1(t) and r2(t).

$$r_i(t) = \hat{w}*x_i(t)(i=1,2)$$

[8] The filter coefficients of the adaptive filters 31-i are updated.

$$h_i(t+1) = h_i(t) + \mu \cdot \hat{e}_i(t) \cdot r_i(t)(i=1,2)$$

Further, the above-mentioned transfer function update function unit 35 will be explained. Note that methods such as the external noise injection method and simultaneous perturbation method are known as the method for updating the transfer function corresponding to the transfer characteristics from the control use speaker 6 to the error microphone 7, while performing active noise reduction. Here, the former method is employed.

Figure 4:
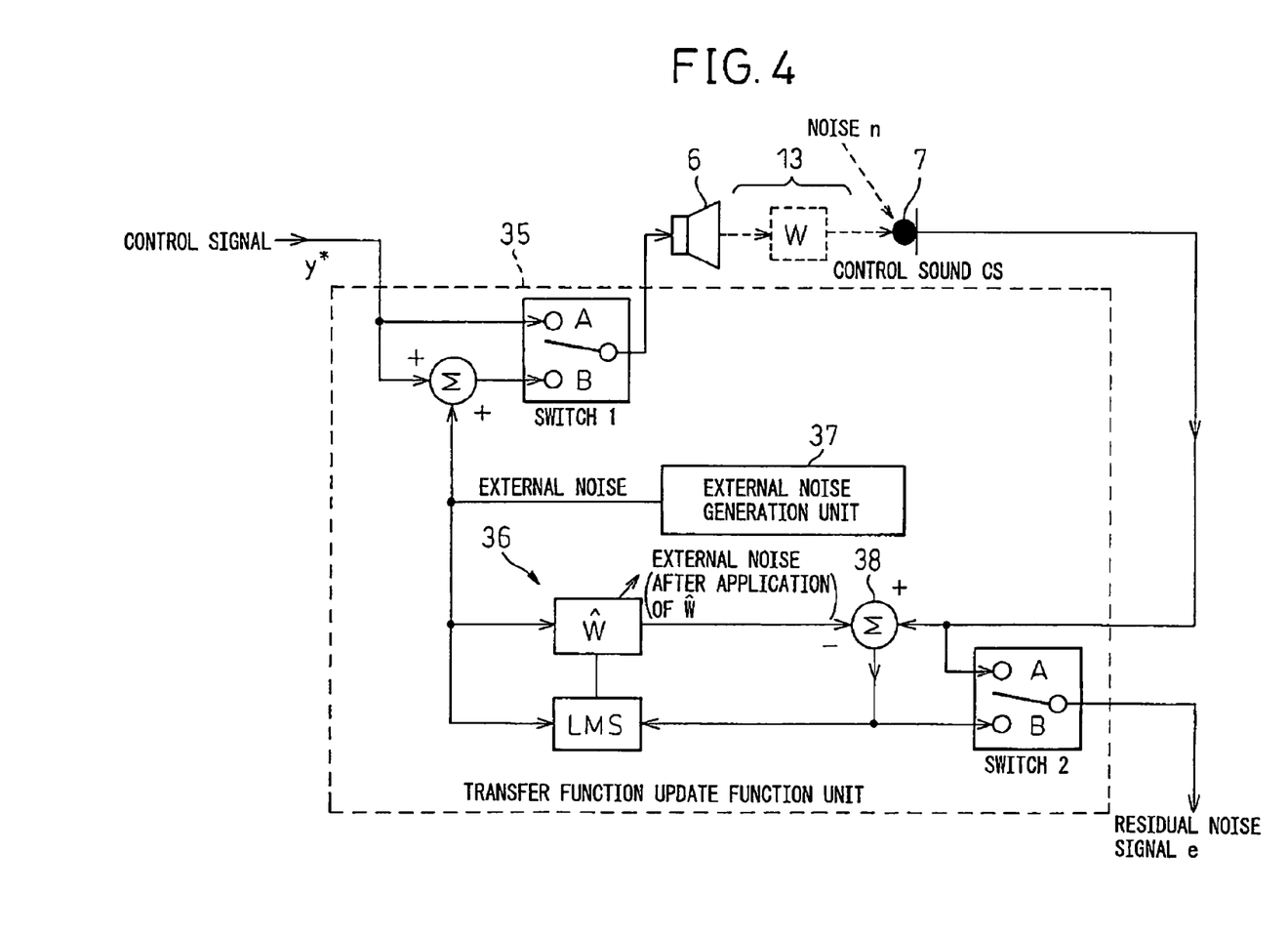
FIG. 4 is a view illustrating an example of the configuration of a transfer function update function unit 35 illustrated in FIG. 3.

FIG. 4 is a view illustrating an example of the configuration of that transfer function update function unit 35. The transfer function update function unit 35 illustrated in this drawing adds, on the one hand, a signal of the external noise and a control signal y* applied to the speaker 6 and, on the other hand, employs an update use adaptive filter 36 which filters that external noise and subtracts the filtered output from the residual noise signal e detected by the error microphone, 7. It operates the update use adaptive filter 36 to estimate the transfer functions so as to minimize the subtracted result and uses the estimated values to update the transfer functions of the digital filters (21, 22, and 23) in FIG. 3.

In more detail, in FIG. 4, the switch 1 and switch 2 switch the contacts from A to B so as to update the above transfer functions. First, the control signal y* and external noise from the external noise generator 37 are added and the added result is output from the control use speaker 6. Further, the signal obtained, at the adaptive filter 36, by convolution of the transfer function with that external noise at the filter 36 is subtracted, at the adder 38, from the signal obtained by the error microphone 7 so that the result (minus sign) of subtraction becomes small. Due to this, it is possible to estimate transfer function expressing the transfer characteristics of the secondary path.

Note that as the above external noise, low level white noise or a sinusoidal signal is used. When that adaptive filter 36 is converged and the transfer function finishes being estimated, the updated filter coefficient is reflected in the transfer functions of the filters (21, 22, and 23). By updating the transfer function of the secondary path at all times in this way, it is possible to improve the stability in selecting the optimal control signal.

Figure 5:
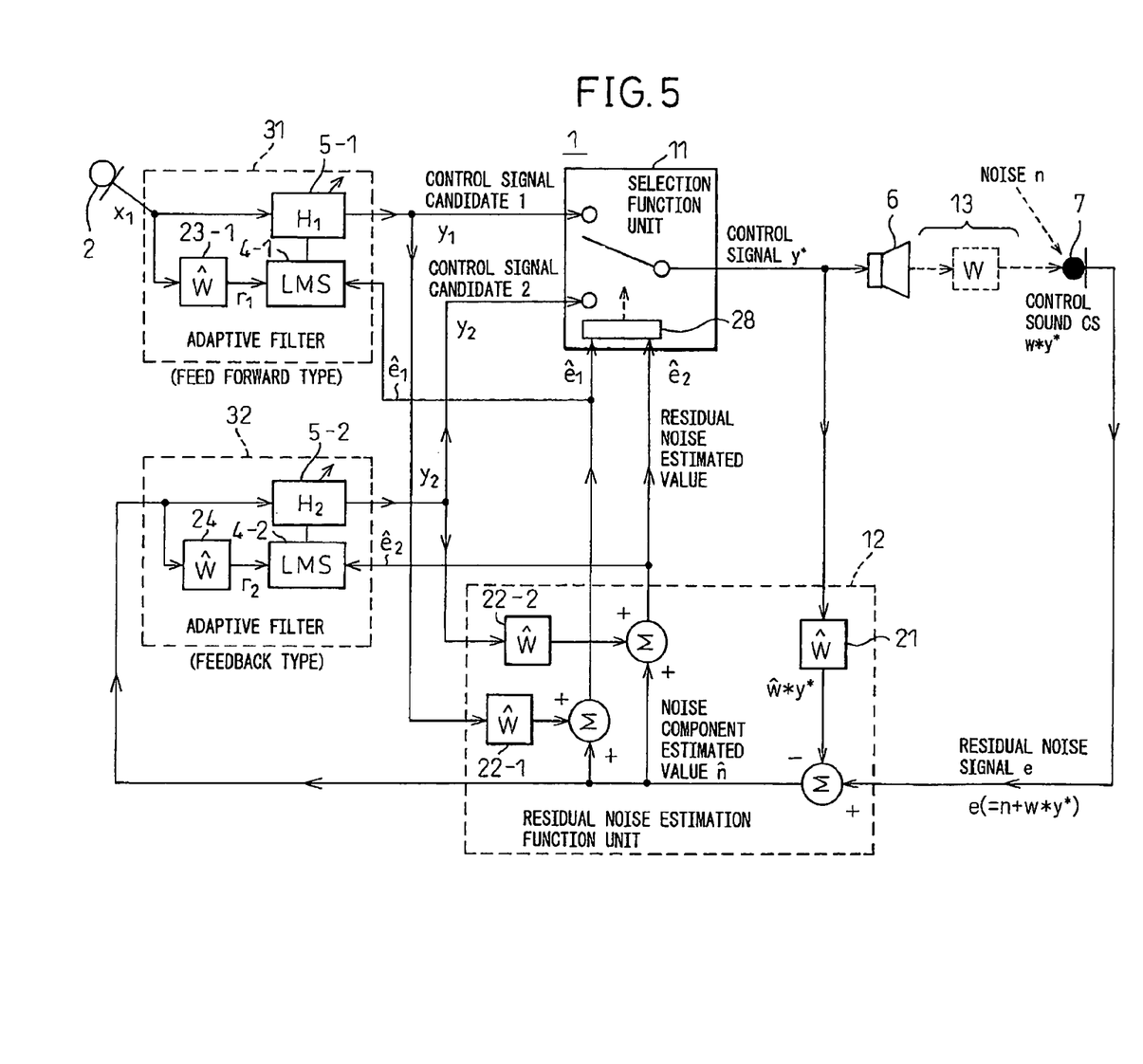
FIG. 5 is a view illustrating a second embodiment.

FIG. 5 is a view showing a second embodiment of the present embodiments. As illustrated in this drawing, this second embodiment has, in addition to the first adaptive filter 31 performing a feedforward operation, a second adaptive filter 32 which performs a feedback operation by receiving, as input, the noise component estimated value /n as a reference signal and filters this input signal. It obtains a single candidate among the plurality of control signal candidates (y1 and y2) produced from the output of this second adaptive filter 32. This feedback type adaptive filter 32 particularly has a large noise reduction effect on noise having periodicity.

The above second adaptive filter 32 has a second FIR filter (4-2 and 5-2) outputting a control signal candidate y2 and a fourth simulating filter 24 used as the above-mentioned transfer characteristic simulating filter. The system uses the filtered output from this fourth simulating filter 24 and the residual noise estimated value /e2 to control the filter characteristics of the second FIR filter (4-2 and 5-2).

Further, the fourth simulating filter 24 is preferably configured by a digital filter having a transfer function equivalent to the transfer characteristics of the sound in the noise reduction area 13 and is further provided with a transfer function update function unit 35 (FIG. 3) updating that transfer function as needed.

Explaining this in further detail, the sensor microphone 2 is arranged at a location corresponding to the noise arrival direction and detects a signal expressing the generated noise (reference signal). The later control use speaker 6, at a later stage, is arranged facing the direction in which it is desired to reduce the noise and outputs a control sound CS interfering with the noise n. The error microphone 7 facing this speaker 6 is arranged at the noise reduction area where it is desired to reduce the noise and detects the residual noise signal e after interference due to interference with the control sound CS.

The residual noise estimation function unit 12 uses a transfer function, identified in advance, expressing transfer characteristics of an analog path (secondary path) from the control use speaker 6 to the error microphone 7 to output the residual noise estimated values /e1 and /e2 for the control signal candidates by using the residual noise signal e and the control signal candidate y1 and control signal candidate y2. Further, the selection function unit 11 selects the optimal control signal y1 or y2 which gives the smallest residual noise at the error microphone 7 by using the residual noise estimated values /e1 and /e2 for the control signal candidates.

The first adaptive filter 31 and the second adaptive filter 32 update the filter coefficients by using the reference signal x1, the estimated value /n of the noise component, and the residual noise estimated values /e1 and/e2 to generate the control signal candidates y1 and y2. The first adaptive filter 31 is a feedforward type receiving, as input, a reference signal from the sensor microphone 2, while the second adaptive filter 32 is a feedback type receiving, as input, a reference signal from the error microphone 7.

The second embodiment of FIG. 5 repeatedly performs the following operations [1] to [8] using the current time as "t".

[1] The error microphone 7 detects the residual noise signal e(t).

[2] The sensor microphone 2 detects the reference signal x1(t).

[3] The detected reference signal x1(t), the estimated value /n(t−1) of the past noise component, and the filter coefficients h1(t) and h2(t) of the adaptive filters 31 and 32 are used to generate the control signal candidates y1(t) and y2(t).

$$\begin{cases} y_1(t) = h_1(t) * x_1(t) \\ y_2(t) = h_2(t) * \hat{n}(t-1) \end{cases}$$

[4] The optimal control signal y*(t) is selected from the control signal candidates y1(t) and y2(t) by using the average values of the past N samples' worth of residual noise estimated values /e1 and /e2, and the control sound CS is output from the control use speaker 6.

$$y*(t) = \begin{cases} y_1(t) \left( \sum_{k=t-N}^{t-1} \hat{e}_1(k)^2 \leq \sum_{k=t-N}^{t-1} \hat{e}_2(k)^2 \right) \\ y_2(t) \left( \sum_{k=t-N}^{t-1} \hat{e}_2(k)^2 > \sum_{k=t-N}^{t-1} \hat{e}_1(k)^2 \right) \end{cases}$$

[5] The estimated value /n(t) of the noise component is calculated by subtracting the control sound component/w*y* (t) from the residual noise signal e(t).

$$\hat{n}(t) = e(t) - \hat{w} * y(t)$$

[6] The residual noise estimated values /e1(t) and /e2(t) for the control signal candidates y1(t) and y2(t) are calculated.

$$\hat{e}_i(t) = \hat{n}(t) + \hat{w} * y_i(t) (i=1,2)$$

[7] For updating the filter coefficients of the adaptive filters 31 and 32, the transfer characteristic /w of the secondary path are convoluted with the reference signal x1(t) and the estimated value /n(t−1) of the past noise component to generate the filtered reference signals r1(t) and r2(t).

$$\begin{cases} r_1(t) = \hat{w} * x_1(t) \\ r_2(t) = \hat{w} * \hat{n}(t-1) \end{cases}$$

[8] The filter coefficients of the adaptive filters 31 and 32 are updated.

$$hi(t+1) = hi(t) + \mu \cdot e(t) \cdot ri(t)(i=1,2)$$

Note that, in the first and second embodiments, as the adaptive algorithm, a filtered-x LMS algorithm is used, but it is also possible to use another adaptive algorithm.

Figure 6:
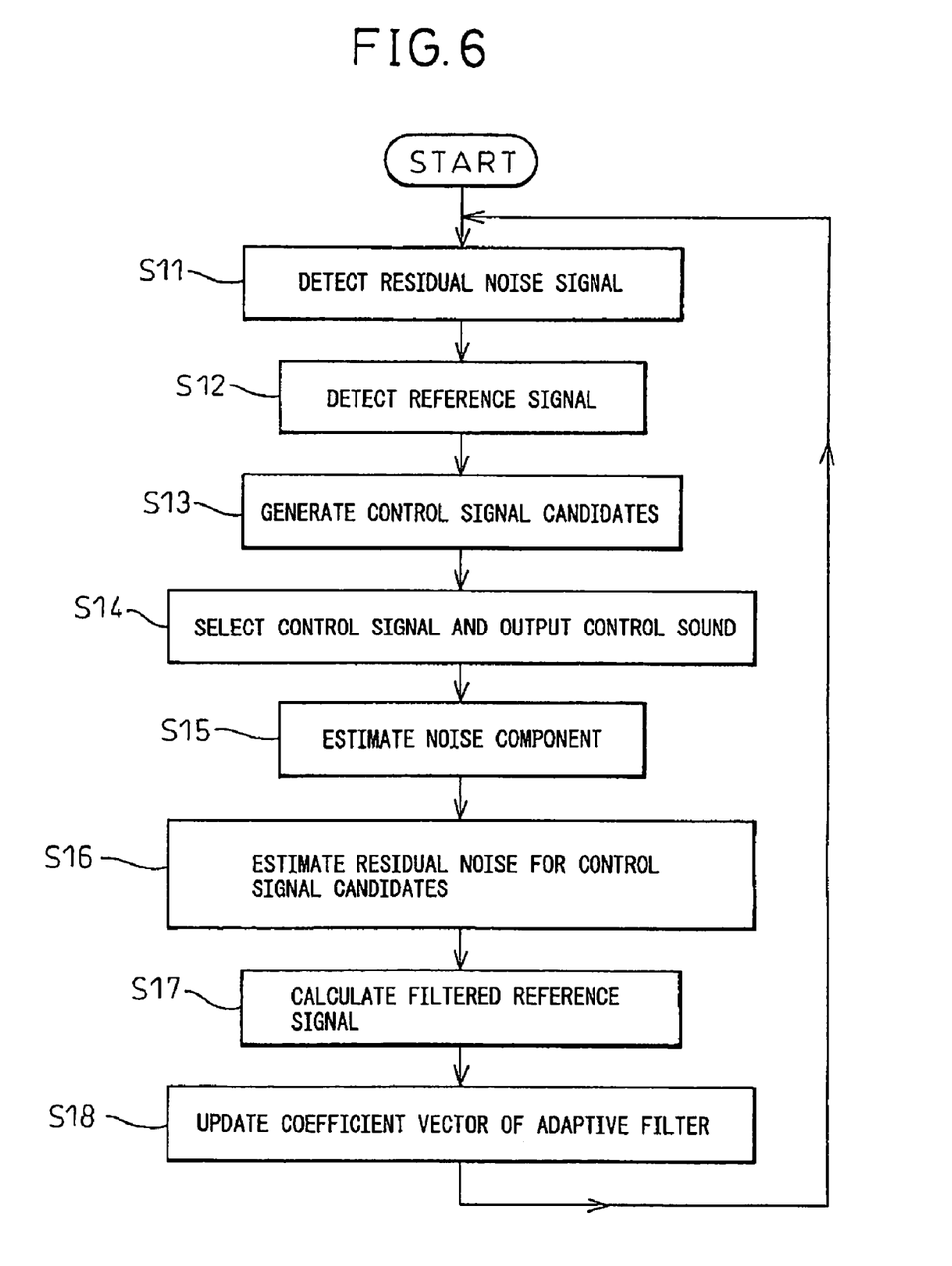
FIG. 6 is a flow chart illustrating the operation in the first and second embodiments.

Expressing the above operations [1] to [8] explained for the second embodiment (the same for the above-mentioned operations [1] to [8] explained for first embodiment) as a flow chart, the result becomes as illustrated in FIG. 6. Steps S11 to S18 in the figure correspond to the above operations [1] to [8]. At steps S11 and S12, the residual noise signal (e) and the reference signal (x) are detected. At step S13, the control signal candidates (y) are generated. Further, at step S14, the optimal control signal (y*) is selected and the corresponding control sound CS is output.

At step S15, the residual noise estimation function unit 12 estimates the noise component (/n). At step S16, that estimated value (/n) is used for estimating the residual noise (/e1, /e2 . . . ) for the control signal candidates (y1, y2 . . . ).

On the other hand, at step S17, the above reference signal and the estimated value (/n) are convoluted with the transfer function (/w) respectively so as to calculate the filtered reference signals (r1, r2 . . . ). Finally, at step S18, the filter coefficient is updated.

Figure 7:
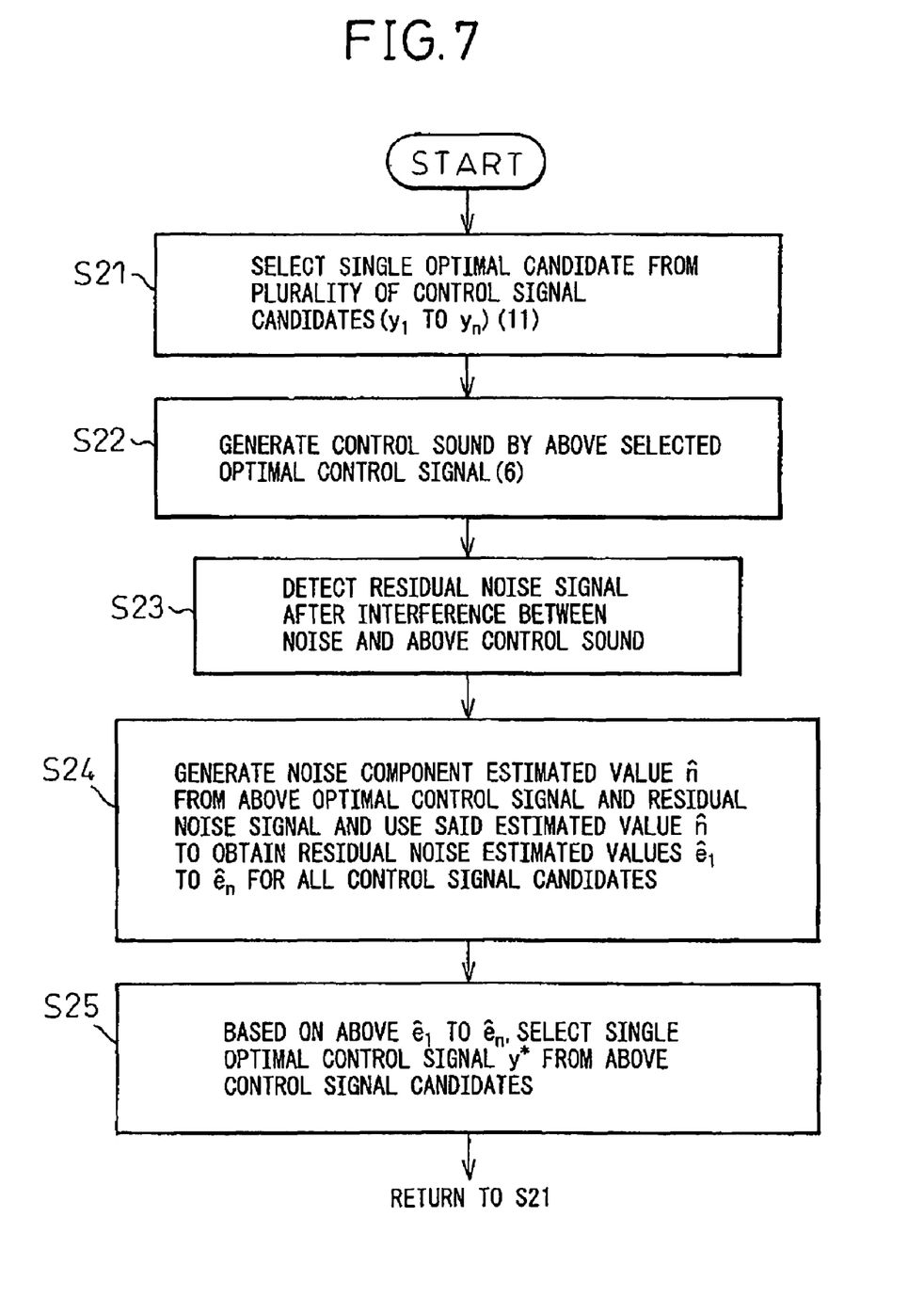
FIG. 7 is a flow chart illustrating the basic operation of the present embodiments.

The above flow chart (FIG. 6) expresses the operation under the level of the embodiment, but the general operation under the basic configuration shown in FIG. 1 and FIG. 2 is as illustrated in FIG. 7.

FIG. 7 is a flow chart illustrating the basic operation of the present embodiments. In the figure, first, at step S21, the optimal control signal y* having a high noise reduction effect is selected from among a plurality of control signal candidates (y1 and y2) as a candidate of the control signal for generating the control sound CS to suppress the noise n. At the second step S22, the control sound CS generated by that optimal control signal y* is output from the speaker 6.

At the third step S23, the error microphone 7 arranged in the noise reduction area 13 forming the area for reduction of the noise n is used to detect the noise, as the residual noise signal e, which remains after interference between the control sound CS from the speaker 6 and the noise n. At the fourth step S24, using the residual noise signal e and the control signal y* as input, the noise component estimated value (/n) estimating the component of the noise is obtained. Using this noise component estimated value (/n), a plurality of residual noise estimated values (/e1 and /e2) simulating the plurality of control signal candidates (y1 and y2) are obtained and output. Further, at the fifth step S25, based on that plurality of residual noise estimated values (/e1 and /e2), the optimal control signal having a high noise reduction effect is selected.

Further, at the fourth step S24, the noise component estimated value /n and residual noise estimated value /e are calculated by using the transfer characteristic simulating filters (21, 22) which simulates the transfer characteristics of the sound in the noise reduction area 13. Further, at the first step S21, the noise n is input as the reference signal x from the sensor microphones 2 and 2, the input signals are filtered at the first adaptive filter 31 and output, and the control signal candidates y are obtained from this. Further, at the fourth step S24, that transfer function is updated, as needed, for the transfer characteristic simulating filters (21, 22, 23, and 24) comprised by digital filters having transfer functions equivalent to the transfer characteristics.

Further, at the first step S21, the noise component estimated value /n may be input and used as a reference signal, where the input signal is filtered by a feedback operation, and this filtered signal is used as one of the plurality of control signal candidates y.

The active noise reduction system 1 of the present embodiments can also be realized by a control program of the present embodiments. That is, it may be realized as an active noise reduction program for making a computer run the following routines: a first routine of selecting and outputting an optimal control signal y* having a high noise reduction effect from a plurality of control signal candidates (y1 and y2) constituting candidates of the control signal for generating a control sound CS to suppress noise n, a second routine of outputting from a speaker 6 the control sound CS which is generated by the optimal control signal y*, a third routine of using an error microphone 7, arranged in a noise reduction area 13 constituting an area to suppress noise n, so as to detect and output noise, as a residual noise signal e, which remains after interference between the control sound CS from the speaker 6 and the noise n, a fourth routine of using the residual noise signal e and the control signal y*, as input, to estimate a noise component and thereby obtain a noise component estimated value /n, using this noise component estimated value /n to perform simulation for a plurality of control signal candidates (y1 and y2) and thereby obtain and output a plurality of residual noise estimated values (/e1 and /e2), and a fifth routine of using the plurality of residual noise estimated values (/e1 and /e2) to select the optimal control signal with a high noise reduction effect.

As explained above, according to these embodiments, when selecting the optimal candidate as a control sound among a plurality of virtual control signal candidates, it becomes possible to accurately select one while considering the transfer characteristics between the speaker 6 and the error microphone 7, and thereby it becomes possible to obtain a superior noise reduction effect.

EXPLANATION OF REFERENCES 1 active noise reduction system
2,2' sensor microphone
3 digital filter
4 LMS algorithm unit
5 FIR filter
6 speaker
7 error microphone
11 selection function unit
12 residual noise estimation function unit
13 noise reduction area
21 first simulating filter
22-1 to 22-n second simulating filter
23 third simulating filter
24 fourth simulating filter
28 comparator
31-1, 31-2 first adaptive filter
32 second adaptive filter
35 transfer function update function unit
36 update use adaptive filter
37 external noise generator

What is claimed is:

1. An active noise reduction system comprising:
   a selection function unit selecting and outputting an optimal control signal having a high noise reduction effect from among a plurality of control signal candidates serving as candidates of a control signal for generating a control sound for suppressing noise by using a plurality of residual noise estimated values for each of the control signal candidates,
   a speaker outputting said control sound generated by said optimal control signal from said selection function unit,
   an error microphone arranged in a noise reduction area forming an area where said noise should be reduced and detecting and outputting noise, as a residual noise signal, remaining after interference between said control sound from said speaker and said noise,
   a residual noise estimation function unit receiving as input said residual noise signal and said control signal, obtaining a noise component estimated value estimating a component of said noise, and using said noise component estimated value to estimate noise for said plurality of control signal candidates and output the plurality of residual noise estimated values, the residual noise estimation function unit having at least transfer characteristic simulated filters which simulate transfer characteristic of a spatial path between a pair of said speaker and said error microphone, and
   said selection function unit selecting the optimal control signal having the high noise reduction effect from among said control signal candidates based on said plurality of residual noise estimated values.

2. An active noise reduction system as set forth in claim 1, wherein said residual noise estimation function unit has a first simulated filter, as a transfer characteristic simulated filter, which filters said control signal and subtracts the output of said first simulated filter from said residual noise signal to obtain said noise component estimated value.

3. An active noise reduction system as set forth in claim 1, wherein said residual noise estimation function unit has a plurality of second simulated filters, as the transfer characteristic simulated filters, which filter said plurality of control signal candidates and adds said noise component estimated value and the outputs of said second simulating filters to obtain said residual noise estimated values.

4. An active noise reduction system as set forth in claim 1, wherein said residual noise estimation function unit is comprised of a digital signal processor, and said transfer characteristic simulated filters in said digital signal processor are digital filters having a transfer functions equivalent to said transfer characteristics.

5. An active noise reduction system as set forth in claim 1, wherein the system has first adaptive filters each receiving, as input, said noise as a reference signal from a sensor microphone and filtering said input signal to obtain a control signal candidate from the first adaptive filter.

6. An active noise reduction system as set forth in claim 5, wherein each of said first adaptive filters has an FIR filter outputting said control signal candidate and a third simulated filter as a transfer characteristic simulating filter and controls the filter characteristics of said FIR filter by the filtered output from said third simulated filter and said residual noise estimated value.

7. An active noise reduction system as set forth in claim 1, wherein said transfer characteristic simulated filters are comprised of digital filters having transfer functions equivalent to said transfer characteristics, and the system is further provided with a transfer function update function unit updating, as needed, said transfer functions.

8. An active noise reduction system as set forth in claim 7, wherein said transfer function update function unit adds, on the one hand, a signal of the external noise and said control signal applied to said speaker and, on the other hand, employs an update use adaptive filter which filters said external noise and subtracts the filtered output from said residual noise signal e detected by the error microphone, operates said update use adaptive filter to estimate said transfer function so that the result after subtraction becomes the minimum, and uses this estimated value to update said transfer function.

9. An active noise reduction system as set forth in claim 5, wherein the system has, in addition to said first adaptive filter for performing a feedforward operation, a second adaptive filter performing a feedback operation by receiving, as input, said noise component estimated value as a reference signal and filtering the input signal to obtain one of said plurality of control signal candidates from the output of said second adaptive filter.

10. An active noise reduction system as set forth in claim 9, wherein said second adaptive filter has a second FIR filter outputting said control signal candidate and a fourth simulated filter serving as a transfer characteristic simulated filter and the system controls the filter characteristics of said second FIR filter by the filtered output from said fourth simulated filter and said residual noise estimated value.

11. An active noise reduction system as set forth in claim 10, wherein said fourth simulated filter is comprised of a digital filter having a transfer function equivalent to transfer characteristics of the sound in said noise reduction area and the system is further provided with a transfer function update function unit for updating said transfer function as needed.

12. An active noise reduction system as set forth in claim 9, wherein when it is judged that there is no optimal control signal having a high noise reduction effect for said selection function unit to select based on said plurality of residual noise estimated values, generation of said control sound from said speaker is stopped.

13. An active noise reduction system as set forth in claim 12, wherein said system has a comparator comparing said residual noise estimated values from said residual noise estimation function unit and a predetermined threshold value and judges that there is no optimal control signal having a high noise reduction effect when all of said residual noise estimated values exceed said predetermined threshold value.

14. An active noise reduction method comprising the steps of
- selecting and outputting an optimal control signal having a high noise reduction effect from among a plurality of control signal candidates constituting candidates of a control signal for generating a control sound to suppress noise by using a plurality of residual noise estimated values for each of the control signal candidates,
- outputting from a speaker the control sound generated by the optimal control signal,
- using an error microphone, arranged in a noise reduction area constituting an area to suppress noise, so as to detect and output noise, as a residual noise signal, which noise remains after interference between the control sound from the speaker and the noise,
- using the residual noise signal and the control signal, as input, to a noise component and thereby obtain a noise component estimated value estimating a component of said noise, using this noise component estimated value to perform simulation for a plurality of control signal candidates and thereby obtain and output a plurality of residual noise estimated values, said noise component estimated value and residual noise estimated values are calculated by using transfer characteristic simulated filters which simulate a transfer characteristic of a spatial path between a pair of the speaker and error microphone, and
- selecting the optimal control signal having the high noise reduction effect from among said control signal candidates based on said plurality of residual noise estimated values.

15. An active noise reduction method as set forth in claim 14, further comprising, in said step of generating the optimal control signal, receiving, as input, said noise as a reference signal from a sensor microphone, filtering said input signal by a first adaptive filter and obtaining said control signal candidates from the filtered output.

16. An active noise reduction method as set forth in claim 14, further comprising, in said step of obtaining the residual noise estimated values, updating said transfer function for said transfer characteristic simulated filter comprised of a digital filter having a transfer function equivalent to said transfer characteristics.

17. An active noise reduction method as set forth in claim 14, further comprising, in said step of generating the optimal control signal, receiving, as input, said noise component estimated value as a reference signal, filtering said input signal by a feedback operation, and using said filtered signal as said one of the plurality of control signal candidates.

18. A non-transitory computer readable medium having a program stored therein to cause a computer to execute
- a first routine of selecting and outputting an optimal control signal having a high noise reduction effect from among a plurality of control signal candidates constituting candidates of a control signal for generating a control sound to suppress noise by using a plurality of residual noise estimated values for each of the control signal candidates,
- a second routine of outputting from a speaker the control sound generated by the optimal control signal,
- a third routine of using an error microphone, arranged in a noise reduction area constituting an area to suppress noise, so as to detect and output noise, as a residual noise signal, which noise remains after interference between the control sound from the speaker and the noise,
- a fourth routine of using the residual noise signal and the control signal, as input, to a noise component and thereby obtain a noise component estimated value estimating a component of said noise, using this noise component estimated value to perform simulation for a plurality of control signal candidates and thereby obtain and output a plurality of residual noise estimated values, said noise component estimated value and residual noise estimated values are calculated by using transfer characteristic simulated filters which simulate a transfer characteristic of a spatial path between a pair of the speaker and error microphone, and
- a fifth routine of selecting the optimal control signal having the high noise reduction effect from among said control signal candidates based on said plurality of residual noise estimated values.

* * * * *